(12) United States Patent
Singer et al.

(10) Patent No.: US 8,465,910 B2
(45) Date of Patent: Jun. 18, 2013

(54) HYBRID LITHOGRAPHIC METHOD FOR FABRICATING COMPLEX MULTIDIMENSIONAL STRUCTURES

(75) Inventors: Jonathan Phillip Singer, Media, PA (US); Jae-Hwang Lee, Chestnut Hill, MA (US); Steven E. Kooi, Lexington, MA (US); Edwin Lorimer Thomas, Natick, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 127 days.

(21) Appl. No.: 13/171,954

(22) Filed: Jun. 29, 2011

(65) Prior Publication Data
US 2012/0164587 A1   Jun. 28, 2012

Related U.S. Application Data

(60) Provisional application No. 61/361,648, filed on Jul. 6, 2010.

(51) Int. Cl.
*G03F 7/26* (2006.01)

(52) U.S. Cl.
USPC ............ 430/325; 430/394; 430/328; 430/330

(58) Field of Classification Search
USPC .............................. 430/322, 328, 330, 1, 394
See application file for complete search history.

(56) References Cited

U.S. PATENT DOCUMENTS

| | | | | |
|---|---|---|---|---|
| 8,014,427 | B1 * | 9/2011 | Anikitchev ........................ | 372/9 |
| 2006/0287470 | A1 * | 12/2006 | Shigematsu et al. .......... | 528/220 |
| 2007/0097470 | A1 * | 5/2007 | Schneider et al. .............. | 359/10 |

OTHER PUBLICATIONS

J.-H. Jang, C. K. Ullal, M. Maldovan, T. Gorishnyy, S. Kooi, C. Koh and E. L. Thomas, Adv. Funct. Mater., 2007, 17, 3027-3041.
H. H. Solak, C. David, J. Gobrecht, V. Golovkina, F. Cerrina, S. O. Kim and P. F. Nealey, Microelectron. Eng., 2003, 67-68, 56-62.
M. Campbell, D. N. Sharp, M. T. Harrison, R. G. Denning and A. J. Turberfield, Nature, 2000, 404, 53-56.
S. Jeon, D. J. Shir, Y. S. Nam, R. Nidetz, M. Highland, D. G. Cahill, J. A. Rogers, M. F. Su, I. F. El-Kady, C. G. Christodoulou and G. R. Bogart, Opt. Express, 2007, 15, 6358-6366.
S. Jeon, J.-U. Park, R. Cirelli, S. Yang, C. E. Heitzman, P. V. Braun, P. J. A. Kenis and J. A. Rogers, Proc. Natl. Acad. Sci. U.S.A., 2004, 101, 12428-12433.
J. S. King, E. Graugnard, O. M. Roche, D. N. Sharp, J. Scrimgeour, R. G. Denning, A. J. Turberfield and C. J. Summers, Adv. Mater., 2006, 18, 1561-1565.

(Continued)

*Primary Examiner* — Kathleen Duda
*Assistant Examiner* — Caleen Sullivan
(74) *Attorney, Agent, or Firm* — Sam Pasternack; MIT Technology Licensing Office

(57) ABSTRACT

Lithographic Method. The method fabricates complex structures and includes depositing a photoresist onto a substrate, the photoresist including a predominantly thermal band of optical absorption possibly due to the incorporation of a doping agent. A three-dimensional pattern is generated within the resist using a first wavelength of light to effect activation of a photoinitiator to produce a latently photostructured resist. Focused laser spike annealing of the photostructured resist with a second wavelength of light selected to be absorbed by the thermally absorbing band to accelerate the photoinduced reaction in the resist is provided. Three-dimensional direct writing may be performed within the resist to define features not part of the interference pattern and the resist is developed to produce the complex structure.

29 Claims, 3 Drawing Sheets

OTHER PUBLICATIONS

T. Kondo, S. Matsuo, S. Juodkazis and H. Misawa, Appl. Phys. Lett., 2001, 79, 725-727.
S. Maruo and K. Ikuta, Appl. Phys. Lett., 2000, 76, 2656-2658.
G. Witzgall, R. Vrijen, E. Yablonovitch, V. Doan and B. J. Schwartz, Opt. Lett., 1998, 23, 1745-1747.
M. Farsari, G. Filippidis and C. Fotakis, Opt. Lett., 2005, 30, 3180-3182.
M. Deubel, G. Von Freymann, M. Wegener, S. Pereira, K. Busch and C. M. Soukoulis, Nat Mater, 2004, 3, 444-447.
L. Li, R. R. Gattass, E. Gershgoren, H. Hwang and J. T. Fourkas, Science, 2009, 324, 910-913.
J. Fischer, G. Von Freymann and M. Wegener, Adv. Mater., 2010, 22, 3578-3582.
C. N. Lafratta, J. T. Fourkas, T. Baldacchini and R. A. Farrer, Angew. Chem. Int. Ed., 2007, 46, 6238-6258.
K. K. Seet, S. Juodkazis, V. Jarutis and H. Misawa, Appl. Phys. Lett., 2006, 89, 024106-024103.
M. Malinauskas, A. Zukauskas, G. Biekauskaite, R. Gadonas and S. Juodkazis, Opt. Express, 2010, 18, 10209-10221.
M. Thiel, J. Fischer, G. Von Freymann and M. Wegener, Appl. Phys. Lett., 2010, 97, 221102-221103.
S. A. Pruzinsky and P. V. Braun, Adv. Funct. Mater., 2005, 15, 1995-2004.
S. A. Rinne, F. Garcia-Santamaria and P. V. Braun, Nat. Phot., 2008, 2, 52-56.
J. Scrimgeour, D. N. Sharp, C. F. Blanford, O. M. Roche, R. G. Denning and A. J. Turberfield, Adv. Mater., 2006, 18, 1557-1560.
M. Li, K. Douki, K. Goto, X. Li, C. Coenjarts, D. M. Smilgies and C. K. Ober, Chem. Mater., 2004, 16, 3800-3808.
H.-W. Li and W. T. S. Huck, Nano Lett., 2004, 4, 1633-1636.
A. Gat, L. Gerzberg, J. F. Gibbons, T. J. Magee, J. Peng and J. D. Hong, Appl. Phys. Lett., 1978, 33, 775-778.
Y. F. Chong, H. J. L. Gossmann, K. L. Pey, M. O. Thompson, A. T. S. Wee and C. H. Tung, IEEE T. Electron Dev., 2004, 51, 669-676.
A. Shima and A. Hiraiwa, Jpn. J. Appl. Phys., 2006, 45, 5708.
T. Jaw-Luen and T. Ming-An, CLEO-PR 2007, 2007, ThP_082.
B. Jung, J. Sha, F. Paredes, C. K. Ober, M. O. Thompson, M. Chandhok and T. R. Younkin, Proc. of SPIE, 2010, 7639, 76390L-76399.
H. Ito, in Microlithography, Springer Berlin / Heidelberg, 2005, vol. 172, pp. 37-245.
C. K. Ullal, M. Maldovan, E. L. Thomas, G. Chen, Y.-J. Han and S. Yang, Appl. Phys. Lett., 2004, 84, 5434-5436.
J.-H. Lee, L. Wang, S. Kooi, M. C. Boyce and E. L. Thomas; Nano Lett., 2010, 10, 2592-2597.
D. Shir, H. W. Liao, S. Jeon, D. Xiao, H. T. Johnson, G. R. Bogart, K. H. A. Bogart and J. A. Rogers, Nano Lett., 2008, 8, 2236-2244.
T. Ergin, N. Stenger, P. Brenner, J. B. Pendry and M. Wegener, Science, 328, 337-339 S2010.
J. Mohanty, D. K. Palit and J. P. Mittal, Proc. Ind. Nat. Sci. Acad. A, 2000, 66, 303-315.
T. Kondo, S. Juodkazis and H. Misawa, Appl. Phys. A-Mater., 2005, 81, 1583-1586.
C. Jung-Dae, J. Hyoung-Tae, P. Young-Sik and H. Jin-Who, Macromol. Mater. Eng., 2006, 291, 1155-1163.
T. M. Hsieh, C. W. Benjamin NG, K. Narayanan, A. C. A. Wan and J. Y. Ying, Biomaterials, 2010, 31, 7648-7652.
T.-L. Li, J. Comput. Phys., 2001, 173, 348-363.
Y. Sensu, A. Sekiguchi, S. Mori and N. Honda, Proc. of SPIE, 2005, 5753, 1170-1185.
S. Torquato, S. Hyun and A. Donev, Phys. Rev. Lett., 2002, 89, 266601.
R. D. Guenard, L. A. King, B. W. Smith and J. D. Winefordner, Anal. Chem., 1997, 69, 2426-2433.
E. Richter, S. Hien and M. Sebald, J. Photopolym. Sci. Technol., 1999, 12, 695-709.
F. Higuchi and J. Muto, Phys. Lett. A, 1981, 81, 95-96.
J. R. Meyer, M. R. Kruer and F. J. Bartoli, J. Appl. Phys., 1980, 51, 5513-5522.
D. C. Meisel, M. Diem, M. Deubel, F. Pérez-Willard, S. Linden, D. Gerthsen, K. Busch and M. Wegener, Adv. Mater., 2006, 18, 2964-2968.
R. Feng and R. J. Farris, J. Micromech. Microeng., 2003, 13, 80.
W. H. Teh, U. Durig, U. Drechsler, C. G. Smith and H. J. Guntherodt, J. Appl. Phys., 2005, 97, 054907-054911.
A. Hayek, Y. Xu, T. Okada, S. Barlow, X. Zhu, J. H. Moon, S. R. Marder and S. Yang, J. Mater. Chem., 2008, 18, 3316-3318.
M. A. A. Neil, R. Juskaitis, T. Wilson, Z. J. Laczik and V. Sarafis, Opt. Lett., 2000, 25, 245-247.
B. Harke, J. Keller, C. K. Ullal, V. Westphal, A. Schönle and S. W. Hell, Opt. Express, 2008, 16, 4154-4162.
T. A. Klar, E. Engel and S. W. Hell, Phys. Rev. E, 2001, 64, 066613.

* cited by examiner

HYBRID LITHOGRAPHIC METHOD FOR FABRICATING COMPLEX MULTIDIMENSIONAL STRUCTURES

This application claims priority to provisional patent application Ser. No. 61/361,648 filed Jul. 6, 2010, the contents of which are incorporated herein by reference.

This invention was made with government support under Grant No. W911NF-07-D-0004 awarded by the Army Research Office. The government has certain rights in this invention.

BACKGROUND OF THE INVENTION

This invention relates to lithography and more particularly to a lithographic method combining large area interference lithography with local area direct write focused laser spike annealing (FLaSk).

In order to advance lithographic capabilities for future applications, innovative strategies must be available in a scalable and cost-effective set of techniques. All lithographic techniques can be considered as either large or small area with respect to the features they pattern. While this is a rather simplistic classification scheme, it illustrates the dichotomy of lithographic strategies, namely: speed versus control. Both are necessary traits of any scalable process. One goal of alternative lithographic strategies is the fabrication of complex 3D architectures; most current 3D fabrication techniques rely on the stacking of multiple 2D structures. This places significant limitation on aspects such as features that cross multiple levels, the ability to have multiple material types in close proximity at the same height, and minimum resolution due to registry and stability considerations. In addition, with more fabricated layers, the number of fabrication steps rapidly increases. The ability to pattern 3D structures of controllable positioning, size, and symmetry across multiple length scales will enable a new generation of optical, acoustic, mechanical, plasmonic, electronic, and other devices. The variety of techniques for creating complex 3D assemblies is ever increasing, along with the variety of possible structures and the degrees of available tunability. Two of the most prominent approaches for 3D patterning currently being investigated are interference lithography (IL)[1-7] and 3D direct write (3DDW)[8-17]. Superscript numbers refer to the references listed herein. The contents of all of these references are incorporated herein by reference. In the aforementioned classification scheme, IL techniques are large area, providing highly uniform structures over areas up to the cm scale by the generation of patterns either by multibeam or phase mask interference, but with little direct control over local defects. On the other hand, 3DDW provides nearly arbitrary control over 3D structures by either single photon[8], multiphoton lithography (MPLDW)[9-14], or other non-linear effects[15-17] with subwavelength resolution ($\lambda/4$ to $\lambda/20$ with new STED inspired techniques[12, 13]), but at the cost of slow, serial patterning. To optimize the advantages of each technique to design scalable 3D processes for locally defined complex structures, a combined approach is a promising strategy.

Some combinations of alternative lithographic techniques have already been successfully demonstrated. Some notable examples are the utilization of DW or UV photomasks to introduce purposeful defects and create local hierarchical structures in 3D media patterned either by IL or colloidal/block copolymer (BCP) self-assembly[18-21]. Another technique that can be usefully combined with IL or self-assembly is multiscale nanoimprint, in which phase mask proximity field nanopatterning (PnP) IL or BCP self-assembly is performed on a structure that has already been defined at the microscale by a larger imprint step[4, 22]. The locally defined hierarchical structures made by these techniques are, however, limited to a uniform microstructure with the same symmetry and filling fraction as the initial 3D template.

Laser spike annealing (LSA) is an alternative to standard thermal treatment in semiconductor technology[23-25]. In this technique, a high intensity continuous wave (CW) or pulsed laser is rapidly scanned across an absorbing surface, such as a silicon wafer. As semiconductor materials generally possess high thermal conductivities, the local temperature at the laser spot spikes to a high value and then, once the laser light is removed, very rapidly drops back to ambient temperature. Because of this, both the temperature and annealing time can be controlled by selection of laser intensity and exposure time. Additionally, annealing can be performed while kinetically avoiding unwanted effects, such as diffusion of the gates. More recently LSA has been applied to the annealing of soft materials for the phase separation of BCPs[26] and chemically amplified photoresist (CAR) post-baking[27]. CARs are a family of resists in which the crosslinking reaction is catalyzed by an additional photoinitiator, such as a photoacid generator (PAG) in the case of cationic crosslinking[28]. Photoinitiation of a single PAG creates an acid that catalyzes many crosslinking reactions. This process, in the standard CAR procedure, is accelerated by post-exposure bake (PEB), generally on a hotplate or in an oven. LSA was approached as a method to activate sub-millisecond crosslinking of a conventional CAR, thereby reducing the unwanted diffusion of photoacid into unexposed regions that occurs to a greater extent during a hotplate PEB[27]. This is possible due to differences in the activation energies of the two processes. The LSA of CARs was only reported for thin films of resist (~100 nm), patterned by conventional lithography. While only nominal improvements in lithographic contrast were demonstrated, this study did show that rapid, high-temperature crosslinking of CARs on the order of 500 µs is possible. Furthermore, the quality of the resultant structures, as measured by both feature resolution and distortion due to PAG diffusion, was equal or better to conventional post-baking.

SUMMARY OF THE INVENTION

The lithographic method according to the invention for fabricating a complex structure includes depositing a photoresist, a suitable example being a chemically amplified photoresist, onto a substrate, the photoresist possibly including an optically absorbing doping agent. The resist may be either positive or negative tone, where the photoresist process may occur by initiation and deprotection causing, for example, chain scission or crosslinking respectively. A three-dimensional interference pattern is generated within the resist using a first wavelength of light, to effect activation of a photoinitiator in the photoresist to produce a latently photostructured resist. The photostructured resist is annealed locally in a direct write or single exposure process by a focused laser spike annealing technique using a second wavelength of light selected to be absorbed by the optically absorbing doping agent or intrinsic absorption of the polymer disparate from the one that induces the resist process (e.g. IR absorption) to accelerate the photoinduced reaction in the resist by a thermal process. This process may be varied discretely or continuously to produce varying crosslink densities, superstructure line and motif feature sizes, and subsequent filling fractions. Three-dimensional direct writing within the resist may also be used to define features not part of the interference pattern. The embodiment described in the invention may be integrated with a different light source in either color or pulse duration such that consecutive 3D direct write may be preformed. Thereafter, the resist is developed to produce the complex structure. In a preferred embodiment, the first and second wavelengths of light are different. The optically absorbing doping agent may include dyes, metallic or semiconductor nanoparticles or metallic shell particles. The selected doping agent must not fully inhibit photoactivation. The three-dimensional interference pattern may be generated by phase mask or multibeam interference. The beam power and/or dwell time of the second wavelength light are selected to control cross linking density and feature size of the interference prepattern. The focused laser spike annealing may use non-Gaussian beams and switchable optics may be provided to allow for multiple feature sizes. A suitable non-Gaussian beam has a toroidal beam shape. The complex structures may be written suspended from the substrate.

In another embodiment, the method includes generating the three-dimensional interference pattern with a phase mask and stable monochromatic light. The focused laser spike annealing may use continuous wave (CW) coherent, pulsed coherant, or incoherent light sources. A system of optics may be provided including a microscopic objective or a multilens array of relatively high numerical aperture. A suitable numerical aperture is greater than 0.4. The method may also include providing a piezoelectric or mechanical stage to control lateral and axial position of focal points of the second wavelength of light. In another embodiment, the exposure may be done in a single step by using a mask such as a zone plate array. The complex structures made according to the invention may be periodic or quasiperiodic. A variable shutter such as acousto-optic modulator may be provided so that line and texture may be varied continuously allowing for three-dimensional filling fraction distributions.

The thermal profile of the resist during focused laser spike annealing is dependent on the thermal conductivity of the resist and its surroundings (substrate, superstrate, side walls, etc.). In another embodiment, the thermal conductivity of the sample or the surroundings may be engineered to control the thermal distribution, either by manipulating the usual experimental setup or incorporating additional components, such as an immersion fluid or thermal conductivity modifying additives to the resist. Additionally, the thermal profile can be altered by changing the baseline temperature before the spike. In another possible embodiment, the baseline temperature could be controlled by incorporation of a heating or cooling apparatus to the experimental setup.

Time is also a critical factor in the post baking of a chemically amplified photoresist due to the kinetic nature of the crosslinking reaction. Ideally, the focus laser spike annealing process need be performed within some maximum time to prevent room temperature crosslinking of the exposed resist. In a possible embodiment, temperature control, as described above could be used to lengthen the time that it is possible to perform focus laser spike annealing by cooling. In addition, the exposed resist may be controllably allowed to crosslink at either room or a controlled temperature to allow the reaction to progress to a certain extent, thus lowering the threshold for the laser spike anneal. Alternatively, this could be performed after the laser spike anneal to further set the locally crosslinked areas. In a preferred embodiment, use of a controlled temperature would allow for both the temperature to be raised for controlled crosslinking then lowered to extend the possible time for patterning.

Though currently there is no clear route to accomplishing this, an idealized embodiment would include a photoresist in which the latent exposure, if not thermally fixed by the focused laser spike anneal, could be "erased", possibly by some additional photochemical means. In this way, multiple exposure (with the same or different wavelength) and focused annealing steps could be performed on the same deposition of resist and subsequent development step.

The ability to pattern 3D periodic architectures with controlled defects according to the invention disclosed herein is important for building progressively more complex photonic or phononic circuits. The speed and flexibility of the FLaSk technique, especially when combined with integrated 3DDW, provides a scalable technique for designing such structures.

The present invention provides enhanced design and cost cutting in a variety of applications. Examples include local positioning of high surface area structures or mixers within microfluidic channels for lab-on-a-chip applications or designing transformation optics structures with continuously varying index/impedance for optical/acoustic cloaks and hyperlenses.

BRIEF DESCRIPTION OF THE DRAWING

FIG. 6a is a three-dimensional direct write logo defect patterned in an approximately 8 μm suspended FLaSk block.

FIG. 6b is a contrast corrected polarized microscope image of the sample of FIG. 6a.

DESCRIPTION OF THE PREFERRED EMBODIMENT

Figure 1:
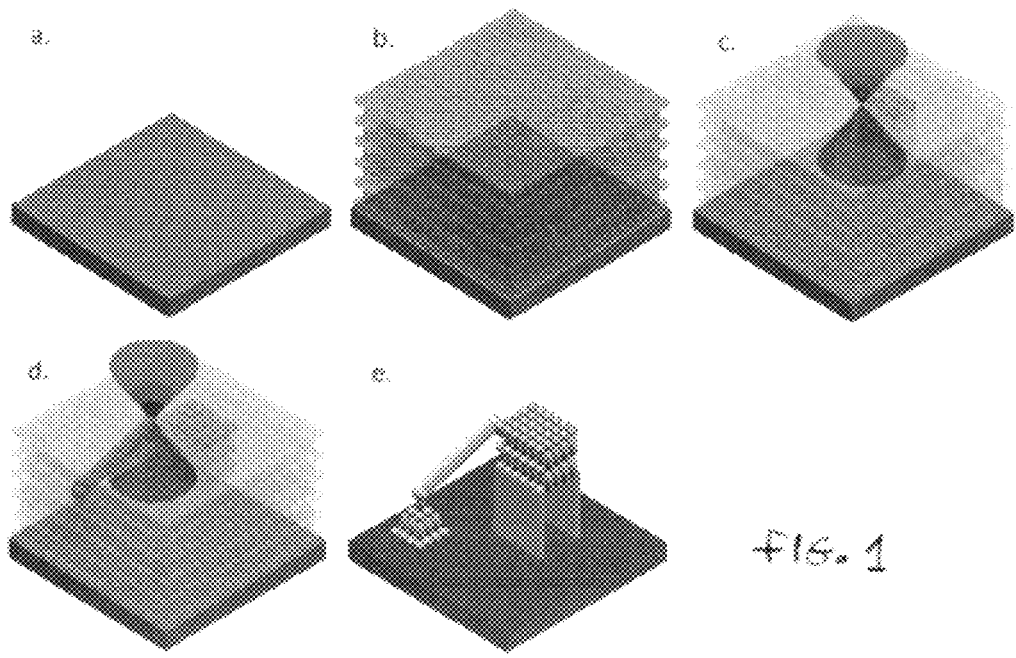
FIGS. 1a-e are schematic illustrations of the combined focused laser spike annealing and three-dimensional direct write processes on a dye-doped chemically amplified resist (CAR).

With reference to FIG. 1, deposition of an active resist layer is shown in FIG. 1a. The resist is exposed by phase mask or multibeam interference lithography as shown in FIG. 1b. FIG. 1c shows a continuous wave heating beam at the wavelength of the dye absorption. FIG. 1d shows the three-dimensional direct write step to define solid features such as supports, defects, or other structures not part of the interference lithography pattern. FIG. 1e shows the development of the patterned structure without additional post-baking.

FIG. 1 thus shows an idealized schematic for the eventual capabilities of FLaSk. In FLaSk, the broadly focused rastering laser beam of LSA is replaced with a tightly focused source inside of the photoresist. This allows for 3D direct write LSA with up to sub-micron 195 features possessing hierarchical substructure defined by the IL step. Ideally, this process occurs without the DW beam performing additional photoinitiation, thus maintaining the contrast and fidelity of the IL. Use of IL to define the lower level of patterning enables a great degree of freedom in design of the final structure, to a much greater extent than, for example, self-assembly of block copolymers or nanoparticles. This is due to the relative ease with which the parameters of the interfering optics or mask can be rationally designed and tuned, leading to previous demonstrations of various structure symmetries and size scales such as diamond-like[29], simple cubic[29], FCC-like[30], body-centered (in the case of most phase mask IL)[4], and even quasicrystalline[31]. By selecting from this broad palette, the pre-image of exposed PAG within the CAR may be defined either globally or vary as a function of position. The FLaSk exposure then serves to select regions where the patterning will be fixed, allowing for the definition of lines, dots, and complex geometries of the chemically biased pattern.

Beyond the spatial definition of the structure, much as with any direct write process, the speed and intensity of the FLaSk may be varied leading to heterogeneous baking. In IL of CARs, the filling fraction, a critical factor in device design, of the final structure is defined by a combination of the exposure fluence and the PEB time. Other than variations due to factors such as optical absorption, fluence and PEB are generally considered to be homogeneous over the sample as normally desired. In the case of FLaSk, however, the thermal history and thus the PEB can be set by the DW parameters. This should, in turn, allow for tuning of the fill fraction of patterned structures and even the introduction of controlled defects by either multiple exposures or continual varying of either parameter. If effectively controlled, this should enable the patterning of 3D devices to a degree that would be impossible by any technique other than 3DDW, such as the serially defined 3D photonic metamaterials by MPLDW recently reported[32].

While the potential speed and parameter space for the FLaSk process of CARs is highly promising, there are components of devices where it is undesirable for the IL substructure to be present. Examples of this include: supports, interconnecting waveguides, or high-Q defects. For the purpose of such structures, 3DDW possesses a great advantage over FLaSk; however, integration onto a direct write stage allows for the possibility of consecutive FLaSk and 3DDW steps to pattern these or any other 3D structure with a differing motif than the IL pattern. Thereby, the design freedom of the FLaSk combined with 3DDW becomes immense, while at the same time, by placing the bulk of the patterning on the FLaSk and minimizing the 3DDW steps, the potential scalability when compared to just 3DDW or a layer-by-layer process is still enhanced.

In terms of practical considerations for FLaSk of CARs, the major property requirement is for the photoresist to contain two distinct ranges of optical absorption—one for the activation of the PAG by either single or multi-photon excitation and one for the LSA. This is in order to accomplish the local PEB with minimal additional photoinitiation. Without the existence of a natural absorption band in the resist, an absorbing agent, such as a dye, that is relatively transparent in the region of the spectrum where crosslinking occurs (generally UV) is needed. As a result, progressive development of FLaSk annealing of CARs will become more and more a question of materials selection and chemical design.

The photoresist utilized in this study was commercially available SU-8 2005, an epoxy based cationic CAR (Micro-Chem Corp.). NIR absorption was introduced by addition of 5,5'-Dichloro-11-diphenylamino-3,3'-diethyl-10,12-ethylenethiatricarbocyanine perchlorate (IR-140) dye (Exciton). This dye was selected for its relative compatibility with SU-8, being both soluble in cyclopentanone (the carrier solvent of the SU-8 2000 series) and shelf-stable with the photochemical. In addition, IR-140, despite being a laser dye, has a relatively low quantum yield (<10%[33]), and thus a relatively high thermal absorption.

Phase mask IL was performed using the maskless proximity field nanopatterning (MPnP) technique developed by the Rogers Group at the University of Illinois[4]. A commercially available master (LightSmyth) was used to create a PDMS inverted replica. Modified SU-8 was then spun onto a substrate consisting of ~5 μm of previously crosslinked unmodified SU-8 on glass with a 500 rpm spreading spin (10 s) followed by a 500-1500 rpm spin (30 s). The under layer of SU-8 acted as both an adhesion layer and also to provide a set of thermal boundary conditions closer to a thicker SU-8 sample to minimize the effect of the high conductivity substrate. Soft bake was then performed at 368 K for >5 min. The PDMS replica was used to create a nanoimprint of the original master structure in the surface of the SU-8 at 368 K, well above the glass transition temperature of the as-spun SU-8 (~323 K). Exposure was conducted with the third harmonic of a Spectra-Physics Quanta Ray Lab 150 Nd-YAG source at 355 nm with nominal power of 300-400 mW at 10 Hz with a 6 ns pulse width. To obtain a uniform dose, the beam was expanded and collimated. Final dose was controlled by the number of shots.

FLaSk and 3DDW were both performed utilizing 780 nm light from a Coherent RegA Ti:Sapphire amplifier laser system. For FLaSk, the system was run in CW; whereas 3DDW utilized an 80 MHz rep rate with 160 fs pulses. Power was controlled by a neutral density filter wheel and measured with a power meter (Newport 818-UV) using a removable mirror placed before the lens. The lens used was a Nikon CFI S Fluor 40× oil immersion objective with numerical aperature 1.3. The last optic before the objective was an NIR dielectric mirror, allowing for simultaneous imaging in transmission with visible (400-700 nm) light via a camera mounted above the stage. Motion of the sample for direct write was controlled by a Physik Instruments PIMars™ piezostage with 300 μm of travel on all three axes mounted on a course micrometer stage for larger motion. Patterning was controlled by a Lab View program that controlled both the stage and an electronic shutter.

Samples were moved to the development step within ~1 hr after IL exposure to limit additional room temperature crosslinking. Sample development was done by immersion in propylene glycol methyl ether acetate (PGMEA) for 20-30 minutes, followed by immediate dipping in isopropyl alcohol (IPA) to rinse the PGMEA and development biproducts. IPA doubly serves to rinse and to act as a lower surface tension solvent to limit the capillarity induced collapse of the written structures. An additional solvent exchange is sometimes employed to further limit capillarity effects[34, 35]. In the case of this study an additional dipping in hexamethyldisilazane (HMDS) was used to replace the IPA with an even lower surface tension solvent before drying with compressed air, as previously utilized in MPLDW post-processing[35].

Scanning electron microscopy (SEM) was performed on a JEOL 6060 at an accelerating voltage of 5 keV. All images presented were taken at a 30° tilt. Focused ion beam (FIB) cross-sections were performed on a JEOL JEM-9320FIB. Optical images were obtained on a Zeiss AxioSkop 2 MAT with a 50× objective.

Simulations of the FLaSk process were conducted through finite element method (FEM) simulations using the commercial package, COMSOL Multiphysics. COMSOL allows for simultaneous solution of multiple differential equations in the same model. For this study, we utilized the packages for thermal conduction and chemical reactions, which allowed for simulations of the coupled crosslinking reaction.

The 3D FLaSk process is much more distinct from conventional post-baking than LSA as it requires control of the temperature profile in a heterogeneous 3D system. This can be reduced to two major issues: (1) selecting an appropriate loading level for the optical absorber and the subsequent laser power level required and (2) determining the expected resolution and the effects of variations in materials properties. Modeling provides insight for the design of various FLaSk experiments.

In the case of dye loading, it was not guaranteed that a sufficient temperature for rapid LSA could be achieved without significantly decreasing the penetration depth of the heating laser. According to the previous work on LSA of CARs[27], sub-millisecond PEB results similar to hotplate PEB were obtained when calculated LSA temperatures were ~20% greater than the corresponding hot plate temperature. This would call for a FLaSk temperature of ~450 K for SU-8. Taking 500 K as a target temperature, a practical restriction of the depth loss was taken to be a variation of 10% in 30 μm of depth (a high value for reasonable depth of uniform UV IL). Using the Beer-Lambert Law, this criterion can be translated into a maximum absorptivity of 35 $cm^{-1}$. To determine the appropriate power range to achieve the target temperature with an optical loss lower than the specified tolerance, a fully thermal steady-state model was set up. This model utilized a geometry typical for high numerical aperture immersion direct write: a glass substrate and superstrate encasing 15 μm of active material. Thermal conductivities for these layers were set at $k_T$⊂ 1.39 W/m-K and 0.3 W/m-K as obtained from the COMSOL materials database and the MicroChem SU-8 2000 series datasheet respectively. The laser heat source was simulated as an analytical intensity distribution of a Gaussian beam. Utilizing the intensity function as opposed to a full electromagnetic model allowed for the problem to be reduced to an axially symmetric one. The (completely thermal) optical absorption value, not accounting for photochemical changes and luminescence, was set to 25 $cm^{-1}$ in the active layer. The power of the heat source focused in the center of the active region was gradually increased while monitoring the peak temperature. This approximate model showed that degree of optical absorption selected for the model was more than sufficient to reach the target temperature of 500 K, which was shown to occur at ~44 mW of light intensity. This is not a high intensity for even hand held laser pointer diodes, let alone lab systems. Given the low intensity value it is possible to continue to decrease the thermal absorption; however, increased overall beam intensity increases the chances for laser induced damage. Additionally, it has recently been demonstrated that it is possible to directly crosslink photoresists with CW light below the absorption threshold at sufficient intensities[17].

Figure 2:
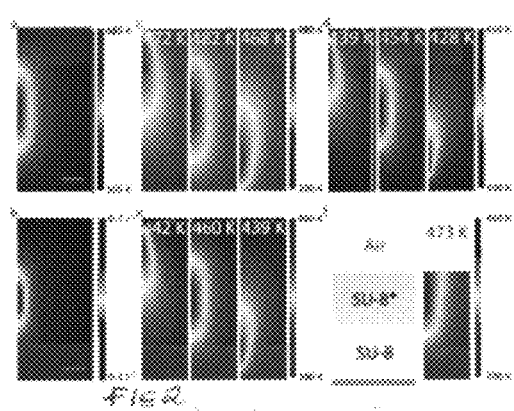
FIGS. 2a-f illustrate thermal profile results for an axially symmetric finite element method simulation of focused laser spike annealing at a power of 35 mW.

This model also allows for some quantitative assessment of the expected resolution and uniformity of the FLaSk technique. FIG. 2a shows the thermal distribution obtained in the active region of the previously described sample geometry at an incident power of 35 mW. The computed FWHM ellipsoid of ΔT (though the distribution is distinctly non-Gaussian) has a diameter of 3 μm and a height of 8.5 μm. It is important to note that this is not necessarily the most accurate metric of the resolution; rather, the rate constant, $k_c$, of the crosslinking reaction serves as a better gauge. Plotted in FIG. 2b is $k_c$ determined by an Arrhenius model using parameters for SU-8 reported in literature[36] ($E_a$=1.4.56 kJ-$mol^{-1}$, A=29.8 $s^{-1}$). The effective resolution is much improved (d=1.8 μm, h=5.0 μm), though in the FLaSk application it may not be the case that the tightest focus is desired for the purpose of rapid patterning. Such simulations can also give insight to the expected uniformity of the ellipsoidal thermal profile. Changing the focus or the material of the sub- or superstrate breaks the symmetry of the glass-resist-glass geometry. FIGS. 2c-e show temperature profiles for three focal points inside of some possible sample geometries: (c) thermally matched with non-photoactive resist above and below, (d) glass above and below, and (e) glass above and a "generic" semiconductor ($k_T$=50 J/m-K) below. In all three cases there is some distortion of the thermal profile due to the change in materials properties. The distortion, however, seems mainly to effect the shape of the profile away from the focal spot. More critical is the change in spot temperature at differing foci. In the worst case of the semiconductor substrate, the temperature of the focal spot changes by only 26 K over a distance of 5 μm, compared to the thermally matched case of 14 K. The change in temperature and profile could be compensated for by use of thermal spacers or clever programming of dynamic power control utilizing, for example, an acousto- or electro-optic power modulator, which, while not currently present on our system, has been used in other direct write systems[14, 37].

The experimental setup utilized in this study is also shown in FIG. 2f. In this geometry, a thinner (5 μm) layer of active resist is placed on top of a precrosslinked adhesion/thermal insulating layer of the same thickness and illuminated from below. This allowed for simplified demonstration of the FLaSk technique as the active layer is on the order of thickness of the hot spot, and further to allow for use of MPnP, which facilitates registration between the IL and 3DDW/FLaSk stage (though this could be replaced by coarse markers).

Figure 3:
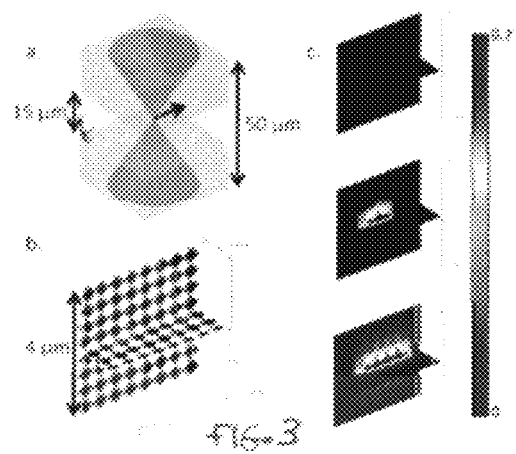
FIGS. 3a-c show a schematic of transient simulation of the focused laser spike anneal, an interference lithography pattern and results of the kinetic model.

Beyond simple thermal simulation, ideally the full physics of the FLaSk process could be simulated, allowing for insight into the various factors that play into controlling the final structure. For example, the effects of the temperature profile and spot gradient mentioned above could be probed. Utilizing the applicability of FEM to multiple physical processes, it is possible to create a thermal and chemical model to predict the final crosslink distribution, with the potential for eventual integration with electromagnetic and even mechanical models for determination of changes to the optical profile and thermal strains that occur during the FLaSk process. Kinetic models of CAR post baking have been developed in the past[36, 38-41] for positive and negative resists, including SU-8[36, 38, 41]. In order to demonstrate the potential for a full simulation of FLaSk, a highly simplified thermal-chemical model was created using typical kinetic parameters utilized in a study of a generalized positive-tone CAR[39] (FIG. 3). Beam and materials parameters from glass-resist-glass study (FIG. 2d) were utilized. Write speed was modeled at 100 μm/s. The initial lithography step was not explicitly modeled, but rather was implemented as the initial reaction completion density of the amplified process inside the material. The profile of the IL exposure was chosen as a Schwartz's P-surface, which is a profile that can be achieved by multibeam IL and possesses a simple mathematical representation. Additionally, the P-surface has been identified as a family of structures that can possess photonic bandgaps[29] and is an optimal for simultaneous high thermal and electrical transport[42]. In this case, the P-surface was implemented with a periodicity of 500 nm and a maximum initial completion fraction of ~0.11, which a typical value for UV exposed CAR[38, 39]. As the FLaSk beam moves through the sample, it progressively defines a line with hierarchical structure prescribed by the P-surface IL step up to a completion fraction of 0.7. These results clearly demonstrate not only that the FLaSk process provides adequate thermal treatment to locally deprotect/crosslink the resist, but, more critically, that this process can take place in a relatively small region and, further, maintain a consistent spot size.

After considerable simulation of the FLaSk procedure exploring process parameters, it appeared that, despite the identification of several key issues, there was a high potential for success with tens of mW of power at an absorption level that would allow for uniform thermal excitation through many microns of active material. In order to experimentally acheive the FLaSk process, however, several factors not present in the model must be considered. One of the most important is the stability of the dye.

As opposed to semiconductor substrates utilized previously in LSA experiments, dye molecules are susceptible to photobleaching and IR-140 is no exception[43]. Further, alteration of dye absorption parameters can result from chemical or thermal stimuli[44, 45]. Due to the nature of FLaSk of dye doped systems, it is of critical importance that these effects be taken into consideration. In the case of the employed IR-140 dye, while stable in solution with SU-8, the IR-140 both inhibited the SU-8 photochemistry and at the same time, lost much of its NIR absorption. The net result of this was the necessary overdoping of the SU-8 at 0.11 wt % IR-140 by solids (0.05 wt % IR-140 in SU 2005 solution). This, in turn led to an unexposed absorption at 780 nm of 92 cm$^{-1}$, as determined by UV-Vis spectrometry. The net result being IL exposures of ~6× greater magnitude and roughly ~2× increase in the necessary FLaSk power. As a result, it is difficult to directly correlate the results with simulations. In future work, a more stable dye system must be identified. Another possibility would be to utilize "solid state" absorbers such as quantum dots or nanoshells; however, these often have 400 strong scattering and/or absorption in the UV.

Figure 4:
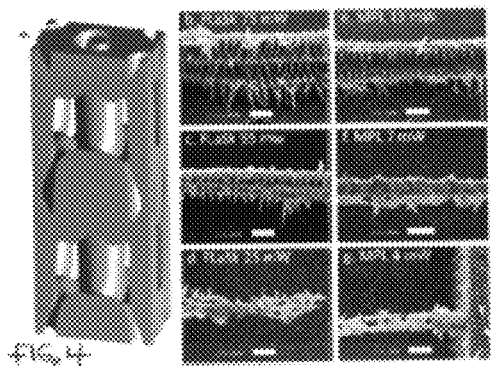
FIG. 4a is an isosuface plot from the finite difference time domain simulation of the intensity distribution below the imprinted phase mask.
FIGS. 4b-d are scanning electron microscope images of focused laser spike annealing lines at different powers written at 100 μm/s.
FIGS. 4e-g are scanning electron microscope images of three-dimensional direct write (3DDW) lines drawn at different powers.

Images of single lines written at 100 μm/s fabricated by FLaSk of SU-8 2005 with 0.5 wt % IR-140 spun at an initial thickness of ~6 μm before imprinting along with the finite difference time domain simulated phase mask structure are shown in FIG. 4. The phase mask employed was utilized to imprint a triangular lattice of 250 nm tall pillars onto the surface of the SU-8 film with radius 120 nm and pitch 600 nm. The phase shift from this commercial mask for 355 nm light in resist of index 1.65 is 0.46λ, close to the ideal half wavelength shift. The resulting structure consists of ~1.3 μm tall pillars with a dose-dependent radius, seperated by and partially overlapping ~750 nm densely structured layers.

The IL intensity was ~20 mW/cm$^2$ and the 780 nm FLaSk beam intensity varied from 25 to 75 mW focused at the center of the resist. These beam intensities lead to fluences of <1 GW/cm$^2$ at the focal spot, three orders of magnitude less than the intensity required for direct ionization and crosslinking of the resist[15, 16]. Also, these intensities demonstrated no direct crosslinking in undoped resist. It is evident that the features present in the phase mask are also present in the patterned structure. Depending on the write power, different filling fractions, including pore-less lines are possible. Altering the write speed (not shown) resulted in a similar effect. It can be seen that the quality of the structure on the bottom of the active layer is lower than that, above due to the asymmetric boundary conditions as shown in FIG. 2f. Other losses in quality on the lower section of the pattern come from an expansion of the pattern to include small patterned regions on the substrate (visible as a hexagonal array of dots). These may be present due to the intensity of the IL being great enough to begin to pattern the resist by optical exposure alone (a well known phenomenon for SU-8[38, 41]), using the adhesion/insulation layer of previously crosslinked SU-8, to "seed" crosslinking in the nearby IL patterned SU-8. Also, as can be seen in the figure, single FLaSk lines, unless overbaked, as in the case of high power (or alternatively low speed) lines such as shown in FIG. 4b, possess little fidelity and often collapse or break apart. This is not a surprising result due to the combination of high aspect ratio of both the FLaSk lines. While this result is undesirable, it is noteworthy that there is little application for single structured lines. In order to obtain any considerable advantage from the method, 3D structures must be fabricated.

As mentioned previously, the structural integrity of FLaSk structures, especially near to the substrate can be low, leading to poor adheasion and dewetting. For this reason, it is important to be able to incorporate more solid structural patterns such as anchors. 3DDW can be employed for this as well as for the patterning of defects and other structures for eventual devices. 3DDW with femtosecond pulses, as opposed to the conventional CAR process, does not require a PEB due to the high pulse energy density causing direct ionic breakdown and crosslinking of the resist[15, 16]. A few examples of solid-center 3DDW structures patterned after the IL exposure are shown in FIGS. 4e-f. It is clear that the pattern of the phase mask is now incorporated into the 3DDW features. While this is likely a result of the additional intensity in the IL-exposed regions, it is also the case that the dye absorption (mostly thermal) in this experiment utilizes the same wavelength as the 3DDW. This could lead to enhanced, single-photon, heating concurrently with the 3DDW patterning, though thermal excitation is known to be reduced by ultrashort pulses[46].

For this reason, and also to increase resolution, diminish photobleaching and LID generation, future studies will incorporate a second wavelength laser source solely for the purpose of the FLaSk excitation. Careful selection of this wavelength will be necessary to avoid the previously mentioned direct CW crosslinking[17].

Figure 6:
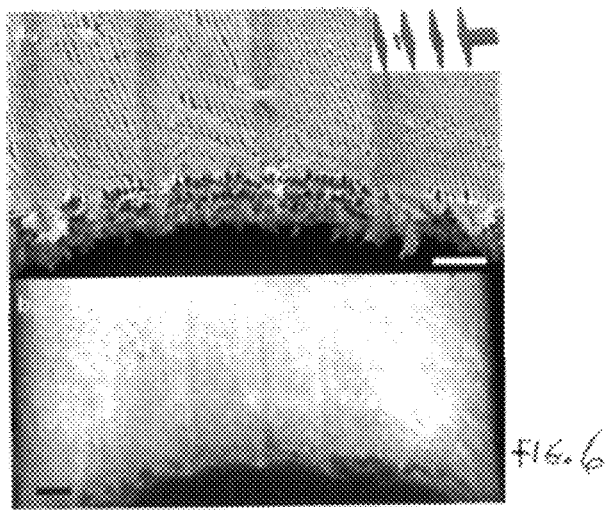
Figure 5:
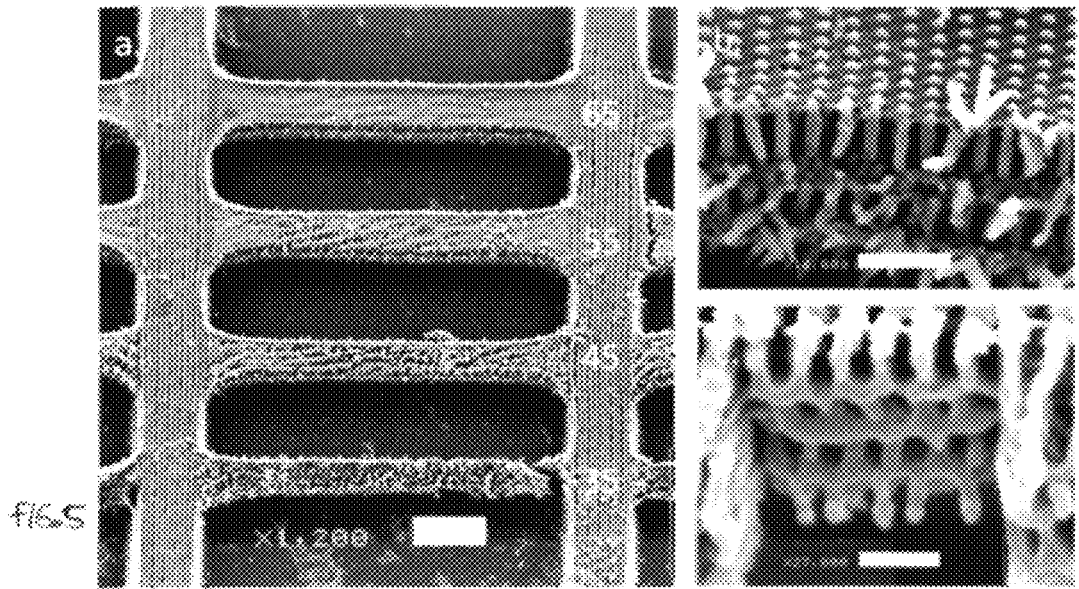
FIG. 5a is a scanning electron microscope image of an example of combined focused laser spike annealing/three-dimensional direct write test structures.
FIG. 5b is a scanning electron microscope image of the side of the 65 mW block.
FIG. 5c is a scanning electron microscope image of a focused ion beam cross-section of a 55 mW block.

The main advantage of the FLaSk technique is the local heirarchical patterning of 3D structures together with 3DDW. As a test pattern, intersecting 3DDW and FLaSk blocks were drawn at several FLaSk powers varying between 35-75 mW (FIG. 5). The vertical blocks are 3DDW patterns at 13 mW which extend through the thickness of the resist as indicated by the imprint pattern on the surface. Progression from disconnected or collapsing structures to solid 3D ones can be observed as FLaSk power is increased. Structural evolution occurred both in the height of the structure, with the lower power (<45 mW) structures not including the bottom layer, and the diameter of the rods, progressing from ~240 to ~290 nm. SEM imaging of side views and FIB cross-sections indicate that the 3D structure extends into the bulk and is the pattern prescribed by the phase mask. Once again, the base of the pattern is distorted; however, in the blocks the deformation in the lower pillars is more apparent than in the case of the lines. This is due to considerable shrinkage of the FLaSk blocks—the blocks are patterned to be 10 μm in width, but, the actual sizes are closer to 7 μm. At the junction between the 3DDW and the FLaSk tapers out to a ~9.5 μm (as can be seen in FIG. 6a), which is more appropriate for SU-8 shrinkage. This amounts to a ~30% shrinkage in the unpinned direction, consistent with the ~8-50% volume shrinkage that has been reported in structured SU-8 from combined crosslinking and capillarity effects[47-49]. Shrinkage out of the plane of the sample is not as severe, because of the planar-like nature of this particular IL distribution. While SU-8 shrinkage has been previously compensated for by purposeful distortion of the IL[47], it may prohibitively complex for this local technique and will have to be carefully handled in device design. Alternatively, a different resist system with less shrinking could be utilized, such as the recently demonstrated poly(glycidyl methacrylate) based systems[50]. Positive-tone resists are also a viable low-shrinkage alternative, and are attractive for applications such as photonics where structure inversion would be necessary. Another notable feature of the FLaSk blocks is the higher fill fraction of the first side wall, as can be seen by the high contrast ridges on the top side of the blocks in FIG. 5a, This is a result of the bleaching of the IR-140 dye: while the first line is patterned with the absorption level possessed by the dye after IL, the surrounding areas are diminished in absorption, leading to subsequent uniform patterning of the remainder of the block. This is also the reason that it is possible to pattern 3D structures at an intensity which for single lines would be oversaturated (i.e. 60-65 mW).

The 3DDW utilized in the above demonstration was essential to prevent the FLaSk structures from detaching from the substrate; however, it is by no means the limit of 3DDW, which, as mentioned, is the most flexible method of pattern definition at the cost of speed. Simultaneous FLaSk of IL and 3DDW to achieve more complex structures will have to be approached with careful consideration of their interaction. One obvious issue is the variable shrinkage in solid vs, 3D structures in most negative-tone CARs such as SU-8, leading to device deformation and cracking (as can be seen in FIG. 5a). Another interesting consideration illustrated by the support patterns is that the 3DDW step occurred before the FLaSk and because of this, were post-baked at the junction region, much as the IL structure. This does not necessarily have to be the case due to 3DDW lines not requiring PEB. The latter patterning method appears to affect the FLaSk step to a lesser extent and also can produce 3DDW structures with a size that is not significantly altered by entering a FLaSk feature.

All key features of the combined FLaSk and 3DDW technique are illustrated by the sample in FIGS. 6a and 6b, where a logo-shaped 3DDW defect has been written in a ~8 µm suspended FLaSk structure patterned in a thicker (~14 µm) resist layer. The 3DDW logo-structure is patterned such that the design is both visible from above and from the side, with some components only extending part way through the FLaSk slab, thus creating a truly 3D defect inside a 3D suspended structure in a single resist process. Shrinkage of the FLaSk structure at or around the 3DDW features can be seen to be suppressed; however, the overall strain is still enough to deform both sets of structures. While not yet at the complexity of the scheme depicted in FIG. 1, this sample both demonstrates the potential to achieve it and the challenges that need be overcome in order to do so.

Despite current limitations, many of which are a case of unoptimized materials/process selection, these FLaSk results indicate the great potential of the technique for hybrid patterning. The combination of solid 3DDW features with local 3D patterning on a single platform already greatly reduces the number of processing steps required to achieve the final pattern when compared to the previously discussed combined methods. In addition, the FLaSk process allows for tuning of the filling fraction of the structure in 3D, up to, with integrated 3DDW, completely solid, which is not present in any of the previously mentioned combined techniques. 3DDW alone has the capacity to accomplish this patterning in one process; however, it is critical to consider the scalability of such an approach. The FLaSk pattern shown in FIG. 6b was drawn in a series of 10 µm by 100 µm blocks of 21 FLaSk lines each at a speed of 1 mm/s (faster than is usually employed in 3DDW), resulting in a patterning time of ~12 sec per block. For comparison, if we define the structure as 4 layers of single-shot pillars with single-shot spacers in a 10 µm by 100 µm array, this amounts to 28900 individual exposures. This would only allow ~0.4 ms per shot, including computation, transit, shutter time and position stabilization (which is already on the order of 4-10 ms on a typical piezo stage), to keep the same total time. Considering that a typical exposure time for 3DDW ranges from ms to s, unoptimized FLaSk has already passed the limit of 3DDW patterning rate. This does not consider the fixed time cost of the IL exposure, which is increasingly small with patterning of more features. While the gain in efficiency is only linear with size, the proportion of enhancement can be increased by either increasing the write speed or reducing the radial or axial resolution of the FLaSk to fit the application via simple point spread function (PSF) manipulation of the focal spot. On the former point, the current piezo system and software utilized are optimized for nanoscale positioning necessary for 3DDW, and its speed is thusly limited by the required stage accuracy of these structures. The fact that the nanoscopic features are patterned in a separate step allows for relaxation of the stage stabilization and maximal write speed limits in future technique development. For manipulation of the PSF, other than the obvious method of changing wavelength or numerical aperture, the most appropriate manipulation technique is the use of intensity and phase modulation optics before the objective to create non-Gaussian focal distributions. This has been used to increase focal point resolution or alter the relative axial and radial resolution[51]. In addition, for generation of deactivation beams for STED microscopy, optics for unusual shapes, such as toroid and distributions without central intensity, have been developed[52, 53]. Use of, for example, a torus optic (a commercially available phase plate), could be utilized to increase the effective lateral spot size by a factor of ~1.5 while not significantly affecting the axial. Finally, it is important to note that the increase in efficiency is dependent also on the IL pattern: the demonstrated phase mask possessed a periodicity of ~1.7λ and a layer-to-layer spacing of ~3λ, by no means the limit of IL resolution. Any reduction of these parameters or the IL wavelength will also lead to gains in efficiency.

Through a combination of proximity field nanopatterning interference lithography and focused laser spike (FLaSk) annealing we have demonstrated an efficient local and rapid patterning of a periodic structure. Additionally, a simulation platform for the testing and predictive design of FLaSk fabrication was developed. The strength of the FLaSk technique, especially in combination with 3D direct write, arises from its flexibility—though we have demonstrated fabrication using a single phase mask, the family of periodic and quasicrystalline structures possible by either phase mask or multibeam interference lithography is unlimited and can be tuned for the application. Further, since FLaSk can select the IL region which is fixed, stiched phase masks of multiple designs can be utilized to pattern multiple structure morphologies in a single IL-FLaSk step by avoiding the regions of overlap in the holograpic patterns (on the order of the thickness of the resist depending on the wavelength and periodicity used). The eventual result should be device fabrication by nearly arbitrary spatial definition of various periodic elements of controllable filling fraction with 3DDW-defined supports, defects, and interconnects. Beyond CARs, the FLaSk technique is likely applicable to other systems, as thermal annealing is a driving force for many processess. Future studies in FLaSk patterning of thermal-absorption-doped photoresists will focus on the optimization of the materials and process selection to improve the overall quality and capability of the technique. As the process develops, there is significant potential for a combined IL-3DDW-FLaSk approach to become a readily scalable technique for patterning of future photonic, phononic, and mechanical devices.

The method according to another aspect of the invention for fabricating complex structures includes providing a predefined hard master mask and then cross-linking a material spread over the hard master mask to make a soft mask. The soft mask is imprinted into softened solid photoresist to create a surface impression in the photoresist. Focal points of light from a direct write system controls light to pass through the surface impression in the photoresist such that light distributions localized by the light affected by the surface impression create localized interference or diffraction patterns in the resist to selectively expose the resist. A preferred embodiment further includes developing the resist and obtaining a three-dimensional structure defined by the master mask.

In a preferred embodiment of this aspect of the invention, the material spread over the hard master mask is a two-part PDMS. In this embodiment, the resist is softened by application of a solvent or by an increase in temperature above the flow temperature of the resist. It is preferred that the direct write system includes optics having a high numerical aperture. It is also preferred that lateral and axial positions of the focal points are controlled as desired. In a preferred embodiment, the lateral and axial positions are controlled by a piezoelectric or mechanical stage. The direct write system may be a single or multi-photon direct write lithography system.

In another preferred embodiment, the direct write system optics include a microscopic objective or multi-lens array. In an embodiment, structures made at various levels of focus are altered by changing parameters of the mask and the writing laser. Suitable parameters include mask shape, beam wavelength, beam profile, beam polarization and the number of beams.

Figure 7:
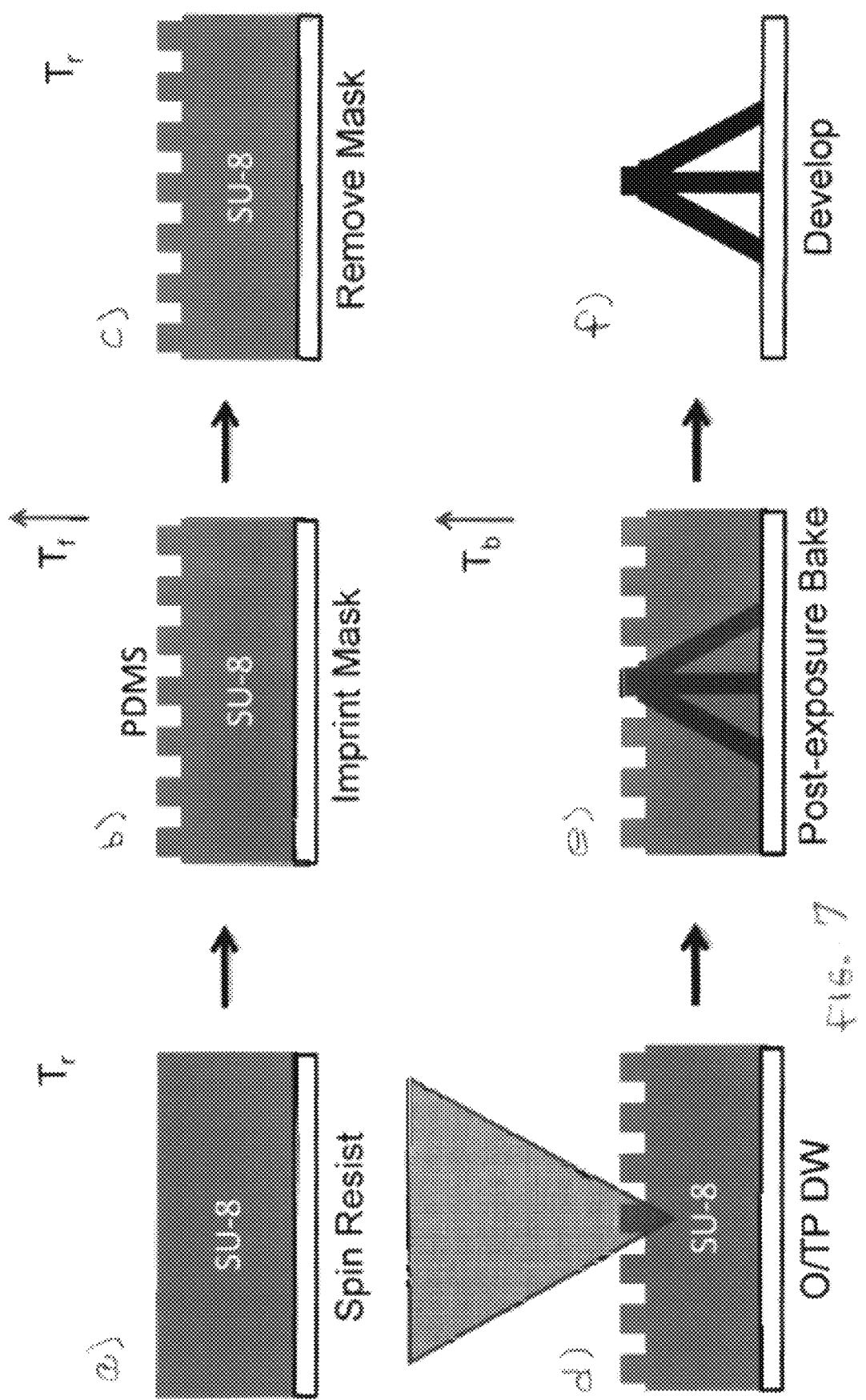
FIGS. 7a-f are schematic illustrations of the process according to another aspect of the invention disclosed herein.

With reference to FIG. 7, the process of this aspect of the invention is illustrated. First of all, a resist is spun onto a substrate and then imprinted with a mask. The mask is removed and then illuminated by the direct write system. After a post-exposure bake the resist is developed resulting in a three-dimensional structure.

REFERENCES

1. J.-H. Jang, C. K. Ullal, M. Maldovan, T. Gorishnyy, S. Kooi, C. Koh and E. L. Thomas, *Adv. Funct. Mater.*, 2007, 17, 3027-3041.
2. H. H. Solak, C. David, J. Gobrecht, V. Golovkina, F. Cerrina, S. O. Kim and P. F. Nealey, *Microelectron. Eng.*, 2003, 67-68, 56-62.
3. M. Campbell, D. N. Sharp, M. T. Harrison, R. G. Denning and A. J. Turberfield, *Nature*, 2000, 404, 53-56.
4. S. Jeon, D. J. Shir, Y. S. Nam, R. Nidetz, M. Highland, D. G. Cahill, J. A. Rogers, M. F. Su, I. F. El-Kady, C. G. Christodoulou and G. R. Bogart, *Opt. Express*, 2007, 15, 6358-6366.
5. S. Jean, J.-U. Park, R. Cirelli, S. Yang, C. E. Heitzman, P. V. Braun, P. J. A. Kenis and J. A. Rogers, *Proc. Natl. Acad. Sci. U.S.A.*, 2004, 101, 12428-12433.
6. J. S. King, E. Graugnard, O. M. Roche, D. N. Sharp, J. Scrimgeour, R. G. Denning, A. J. Turberfield and C. J. Summers, *Adv. Mater.*, 2006, 18, 1561-1565.
7. T. Kondo, S. Matsuo, S. Juodkazis and H. Misawa, *Appl. Phys. Lett.*, 2001, 79, 725-727.
8. S. Maruo and K. Ikuta, *Appl. Phys. Lett.*, 2000, 76, 2656-2658.
9. G. Witzgall, R. Vrijen, E. Yablonovitch, V. Doan and B. J. Schwartz, *Opt. Lett.*, 1998, 23, 1745-1747.
10. M. Farsari, G. Filippidis and C. Fotakis, *Opt. Lett.*, 2005, 30, 3180-3182.
11. M. Deubel, G. von Freymann, M. Wegener, S. Pereira, K. Busch and C. M. Soukoulis, *Nat Mater*, 2004, 3, 444-447.
12. L. Li, R. R. Gattass, E. Gershgoren, H. Hwang and J. T. Fourkas, *Science*, 2009, 324, 910-913.
13. J. Fischer, G. von Freymarin and M. Wegener, *Adv. Mater.*, 2010, 22, 3578-3582.
14. C. N. LaFratta, J. T. Fourkas, T. Baldacchini and R. A. Farrer, *Angew. Chem. Int. Ed.*, 2007, 46, 6238-6258.
15. K. K. Seet, S. Juodkazis, V. Jarutis and H. Misawa, *Appl. Phys. Lett.*, 2006, 89, 024106-024103.
16. M. Malinauskas, A. Zukauskas, G. Biekauskaite, R. Gadonas and S. Juodkazis, *Opt. Express*, 2010, 18, 10209-10221.
17. M. Thiel, J. Fischer, G. von Freyrnann and M. Wegener, *Appl. Phys. Lett.*, 2010, 97, 221102-221103.
18. S. A. Pruzinsky and P. V. Braun, *Adv. Funct. Mater.*, 2005, 15, 1995-2004.
19. S. A. Rinne, F. Garcia-Santamaria and P. V. Braun, *Nat. Phot.*, 2008, 2, 52-56.
20. J. Scrimgeour, D. N. Sharp, C. F. Blanford, O. M. Roche, R. G. Denning and A. J. Turberfield, *Adv. Mater.*, 2006, 18, 1557-1560.
21. M. Li, K. Douki, K. Goto, X. Li, C. Coenjarts, D. M. Smilgies and C. K. Ober, *Chem. Mater.*, 2004, 16, 3800-3808.
22. H.-W. Li and W. T. S. Huck, *Nano Lett.*, 2004, 4, 1633-1636.
23. A. Gat, L. Gerzberg, J, F. Gibbons, T. J. Magee, J. Jeng and J. D. Hong, *Appl. Phys. Lett.*, 1978, 33, 775-778.
24. Y. F. Chong, H. J. L. Gossmann, K. L. Pey, M. O. Thompson, A. T. S. Wee and C. H. Tung, *IEEE T Electron Dev.*, 2004, 51, 669-676.
25. A. Shima and A. Hiraiwa, *Jpn. J. Appl. Phys.*, 2006, 45, 5708.
26. T. Jaw-Luen and T. Ming-An, *CLEO-PR 2007*, 2007, ThP_082.
27. B. Jung, J. Sha, F. Paredes, C. K. Ober, M. O. Thompson, M. Chandhok and T. R. Younkin, *Proc. of SPIE*, 2010, 7639, 76390L-76399.
28. H. Ito, in *Microlithography*, Springer Berlin/Heidelberg, 2005, vol. 172, pp. 37-245.
29. C. K. Ullal, M. Maldovan, E. L. Thomas, G. Chen, Y.-J. Han and S. Yang, *Appl. Phys. Lett.*, 2004, 84, 5434-5436.
30. J.-H. Lee, L. Wang, S. Kooi, M. C. Boyce and E. L. Thomas, *Nano Lett.*, 2010, 10, 2592-2597.
31. D. Shir, H. W. Liao, S. Jeon, D. Xiao, H. T. Johnson, G. R. Bogart, K. H. A. Bogart and J. A. Rogers, *Nano Lett.*, 2008, 8, 2236-2244.
32. T. Ergin, N. Stenger, P. Brenner, J. B. Pendry and M. Wegener, *Science*, 328, 337-339 S2010.
33. J. Mohanty, D. K. Palit and J. P. Mittal, *Proc. Ind Nat. Sci. Acad. A*, 2000, 66, 303-315.
34. T. Kondo, S. Juodkazis and H. Misawa, *Appl. Phys. A-Mater.*, 2005, 81, 1583-1586.
35. C. N. LaFratta, Doctor of Philosophy, University of Maryland, 2006.
36. C. Jung-Dae, J. Hyoung-Tae, P. Young-Sik and H. Jin-Who, *Macromol. Mater, Eng.*, 2006, 291, 1155-1163.

37. T. M. Hsieh, C. W. Benjamin Ng, K. Narayanan, A. C. A. Wan and J. Y. Ying, *Biomaterials*, 2010, 31, 7648-7652.
38. S. Yoshihisa, S. Atsushi, K. Yoshiyuki, M. Satoshi, H. Nao and W. William D, *J. Photopolym. Sci. Technol.*, 2005, 18, 125-132.
39. T.-L. Li, *J. Comput. Phys.*, 2001, 173, 348-363.
40. J. S. Petersen, C. A. Mack, J. W. Thackeray, R. F. Sinta, T. H. Fedynyshyn, J. M. Mori, J. D. Byers and D. A. Miller, *Spill Sci. Technol. Bull.*, 1995, 2438, 153-166.
41. Y. Sensu, A. Sekiguchi, S. Mori and N. Honda, *Proc. of SPIE*, 2005, 5753, 1170-1185.
42. S. Torquato, S. Hyun and A. Donev, *Phys. Rev. Lett.*, 2002, 89, 266601.
43. R. D. Guenard, L. A. King, B. W. Smith and J. D. Winefordner, *Anal. Chem.*, 1997, 69, 2426-2433.
44. E. Richter, S. Hien and M. Sebald, *J. Photopolym. Sci. Technol.*, 1999, 12, 695-709.
45. F. Higuchi and J. Muto, *Phys. Lett. A*, 1981, 81, 95-96.
46. J. R. Meyer, M. R. Kruer and F. J. Bartoli, *J. Appl. Phys.*, 1980, 51, 5513-5522.
47. D. C. Meisel, M. Diem, M. Deuhel, F. Pérez-Willard, S. Linden, D. Gerthsen, K. Busch and M. Wegener, *Adv. Mater.*, 2006, 18, 2964-2968.
48. R. Feng and R. J. Farris, *J. Micrornech. Microeng.*, 2003, 13, 80.
49. W. H. Teh, U. Durig, U. Drechsler, C. G. Smith and H. J. Guntherodt, *J. Appl. Phys.*, 2005, 97, 054907-054911.
50. A. Hayek, Y. Xu, T. Okada, S. Barlow, X. Zhu, J. H. Moon, S. R. Marder and S. Yang, *J. Mater. Chem.*, 2008, 18, 3316-3318.
51. M. A. A. Neil, R. Juskaitis, T. Wilson, Z. J. Laczik and V. Sarafis, *Opt. Lett.*, 2000, 25, 245-247.
52. B. Harke, J. Keller, C. K. Ullal, V. Westphal, A. Schönle and S. W. Hell, *Opt. Express*, 2008, 16, 4154-4162.
53. T. A. Klar, E. Engel and S. W. Hell, *Phys. Rev. E*, 2001, 64, 066613.

What is claimed is:

1. Lithographic method for fabricating a complex structure comprising:
   depositing a photoresist onto a substrate;
   generating a three-dimensional optical pattern within the resist using a first wavelength of light to effect activation of a photoinitiator in the resist to produce a latently photostructured resist;
   focused laser spike annealing of the photostructured resist with a second wavelength of light, selected to be absorbed by the photoresist accelerate the photoinduced reaction of the first exposure in the resist locally by production of heat and;
   developing the resist to produce the complex structure wherein the amount of time before performing the focused laser spike annealing is controlled to control the progression of the crosslinking reaction of the exposed areas.

2. The lithographic method of claim 1 wherein an additional absorbing dopant is incorporated.

3. The lithographic method of claim 2 wherein the optically absorbing doping agent comprises dyes, metallic or semiconductor nanoparticles or metallic shell particles.

4. The lithographic method of claim 1 wherein three-dimensional direct writing is subsequently performed within the resist to define features not part of the interference pattern using a writing process with disparate optical parameters of either the lithographic steps described in claim 1.

5. The lithographic method of claim 1 wherein the first and second wavelengths of light are different.

6. The lithographic method of claim 1 wherein the optically absorption arises from intrinsic absorption of one or more components of the photoresist.

7. The lithographic method of claim 1 wherein the three-dimensional optical pattern is generated by multiple exposures.

8. The lithographic method of claim 1 wherein the three-dimensional optical pattern is generated by phase mask or multibeam interference lithography.

9. The lithographic method of claim 8 wherein phase mask interference lithography is used and the mask contains multiple patterns and/or alignments.

10. The lithographic method of claim 1 wherein the beam power and/or dwell time of the second exposure is selected to variably control cross linking density, feature size, and subsequently fill fraction.

11. The lithographic method of claim 1 wherein the focused laser spike annealing uses a system of optics including a microscopic objective or multi-lens array of relatively high numerical aperture.

12. The lithographic method of claim 11 further providing switchable optics to allow for multiple feature sizes.

13. The lithographic method of claim 11 wherein the numerical aperture is greater than 0.4.

14. The lithographic method of claim 1 wherein the focused laser spike annealing uses non-Gaussian focused beams.

15. The lithographic method of claim 14 wherein the non-Gaussian beam has a toroidal beam shape.

16. The lithographic method of claim 1 wherein the complex structures are suspended above the substrate.

17. The lithographic method of claim 1 wherein the focused laser spike annealing uses continuous wave, pulse, or incoherent light sources.

18. The lithographic method of claim 17 further including providing a piezoelectric or mechanical stage or galvano or polygon mirrors to control lateral and axial position of focal points of the second wavelength light in a direct write process.

19. The lithographic method of claim 1 where the lateral and axial positioning of the focal points are controlled by a single mask optic such as a zone plate array to write in a single exposure.

20. The lithographic method of claim 1 wherein the complex structure is periodic or quasiperiodic.

21. The lithographic method of claim 1 wherein the photoresist is a positive or negative tone chemically amplified photoresist.

22. The lithographic method of claim 1 further including a variable shutter so that line and texture may be varied discretely or continuously allowing for three-dimensional filling fraction distributions.

23. The lithographic method of claim 1 further manipulating the thermal properties of the resist to affect the thermal distribution.

24. The lithographic method of claim 23 where manipulation is performed by changing the substrate, superstrate, immersion liquid or other sample features to manipulate the thermal conductivity surrounding the resist.

25. The lithographic method of claim 23 where the manipulation is performed by altering thermal conductivity of the resist with fillers such as carbon nanotubes.

26. The lithographic method of claim 23 where the manipulation is performed by heating or cooling the resist or substrate.

27. The lithographic method of claim 1 where the temperature is lowered to slow the rate of the crosslinking reaction.

28. The lithographic method of claim 1 where the temperature is raised to accelerate the rate of the crosslinking reaction.

29. Lithographic method for fabricating a complex structure comprising:
- depositing a photoresist onto a substrate;
- generating a three-dimensional optical pattern within the resist using a first wavelength of light to effect activation of a photoinitiator in the resist to produce a latently photostructured resist;
- focused laser spike annealing of the photostructured resist with a second wavelength of light selected to be absorbed by the photoresist to accelerate the photoinduced reaction of the first exposure in the resist locally by production of heat and;
- developing the resist to produce the complex structure where the three-dimensional optical exposure is cleared by an additional step allowing for multiple cycles of exposure and annealing in the same deposited resist.

* * * * *